US008007285B2

(12) United States Patent
Usui et al.

(10) Patent No.: US 8,007,285 B2
(45) Date of Patent: Aug. 30, 2011

(54) CIRCUIT DEVICE AND MANUFACTURING METHOD THEREFOR

(75) Inventors: Ryosuke Usui, Ichinomiya (JP); Takeshi Nakamura, Isesaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 18 days.

(21) Appl. No.: 12/129,860

(22) Filed: May 30, 2008

(65) Prior Publication Data

US 2008/0299789 A1 Dec. 4, 2008

(30) Foreign Application Priority Data

May 31, 2007 (JP) ................................ 2007-146244

(51) Int. Cl.
*H01R 12/00* (2006.01)

(52) U.S. Cl. ......................................... 439/65; 361/764

(58) Field of Classification Search .................... 439/65, 439/68, 69, 70, 71; 174/259–264; 361/763, 361/764, 782–784; 257/723–730, 787–790; 428/209–211.1

See application file for complete search history.

(56) References Cited

U.S. PATENT DOCUMENTS 3,781,596 A * 12/1973 Galli et al. .................... 361/751
6,340,841 B2 * 1/2002 Iijima et al. .................. 257/700
6,718,631 B2 * 4/2004 Takeuchi ........................ 29/852
6,797,890 B2 * 9/2004 Okubora et al. .............. 174/260
6,841,884 B2 * 1/2005 Shizuno ........................ 257/777
6,909,054 B2 * 6/2005 Sakamoto et al. ............ 174/260
6,930,256 B1 * 8/2005 Huemoeller et al. ......... 174/260
7,371,976 B2 * 5/2008 Wakihara et al. ............. 174/262
7,768,132 B2 * 8/2010 Igarashi et al. ............... 257/774
2003/0111737 A1 * 6/2003 Katagiri et al. ............... 257/777

FOREIGN PATENT DOCUMENTS

JP 11-204720 7/1999
JP 2001-237338 8/2001
JP 2003-197856 7/2003
JP 2005-123223 5/2005
JP 2006-261510 9/2006

* cited by examiner

*Primary Examiner* — T C Patel
*Assistant Examiner* — Travis Chambers
(74) *Attorney, Agent, or Firm* — Fish & Richardson P.C.

(57) ABSTRACT

A circuit device is made smaller in higher. The circuit device includes a wiring substrate, a first circuit element, and a second circuit element. The circuit substrate includes an insulating resin layer, a wiring layer provided on a main surface of the insulating resin layer, and a wiring layer provided on the other main surface of the insulating resin layer. The wiring layer includes first interconnectors to which the first circuit element connects, and wiring portions. The film thickness of the first interconnector is made thinner than that of the wiring portion. The wiring layer includes second interconnectors and wiring portions. The first interconnectors and the second interconnectors are connected through the medium of conductors.

5 Claims, 4 Drawing Sheets

SURFACE L1
SURFACE L2
22
56
55
54
58
52
70
62
66
68
64

22
56
55
54
58
52
59
70
62
66
68
64

CIRCUIT DEVICE AND MANUFACTURING METHOD THEREFOR

CROSS-REFERENCE TO RELATED APPLICATIONS

This application is based upon and claims the benefit of priority from the prior Japanese Patent Application No. 2007-146244, filed on May 31, 2007, the entire contents of which are incorporated herein by reference.

BACKGROUND OF THE INVENTION

1. Field of the Invention

The present invention relates to a circuit device and a method for manufacturing the circuit devices.

2. Description of the Related Art

Portable electronic devices, such as mobile phones, PDAs, DVCs and DSCs, are gaining increasing sophistication in functions and features. And to be accepted by the market, they have to be smaller in size and lighter in weight, and for the realization thereof, there is a growing demand for highly-integrated system LSIs. On the other hand, these electronic devices are desired to be easier or handier to use, and therefore the LSIs used in those devices are required to be more functionally sophisticated and better performing. For this reason, the higher integration of LSI chips is causing increases in I/O count, which in turn generates demand for smaller packages. To satisfy both these requirements, it is strongly desired that semiconductor packages suited for the high board density packaging of semiconductor components be developed. To meet such needs, a variety of packaging technologies called CSP (Chip Size Package) are being developed.

With the downsizing of portable electronic devices accomplished so far, further reduction in the thickness of a circuit device is desired. For example, making a circuit device, used in the mobile phone, thinner by a few μm can sufficiently contribute to the further downsizing of the mobile phone.

SUMMARY OF THE INVENTION

The present invention has been made in view of the foregoing problems to be resolved, and a general purpose thereof is to provide a technology for making a circuit device smaller in height.

One embodiment of the present invention provides a circuit device. The circuit device comprises: a substrate; a first wiring layer including a first interconnector and a wiring portion provided on one face of the substrate; a second wiring layer including a second interconnector provided on the other face of the substrate; a conductor, penetrating through the substrate, which electrically connects the first interconnector and the second interconnector; and a circuit element mounted on the first interconnector, wherein the film thickness of the first interconnector is less than that of the wiring portion.

In the circuit device according to the above-described embodiment, the second interconnector may be covered with a metal whose ionization tendency is smaller than that of a metal forming the first interconnector.

In the circuit device according to the above-described embodiment, the circuit element may be flip-chip connected to the first interconnector.

Another embodiment of present invention provides a method for manufacturing a circuit device. The method for manufacturing a circuit device comprises: forming a first wiring layer which includes a first interconnector on one face of a substrate; forming a second wiring layer which includes a second interconnector electrically connected to the first interconnector, the second interconnector being provided on the other face of the substrate; covering the second interconnector with a metal whose ionization tendency is smaller than that of a metal forming the first interconnector; forming a pre-flux film on a surface of the first interconnector by subjecting the first interconnector to an organic solderability preservative processing; and mounting a circuit element on the first interconnector.

In the method for manufacturing a circuit device according to the above-described embodiment, a metal forming the first interconnector may be copper and a metal covering the second interconnector may be gold.

It is to be noted that any arbitrary combinations or rearrangement, as appropriate, of the aforementioned constituting elements and so forth are all effective as and encompassed by the embodiments of the present invention.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

The embodiments will now be hereinafter described with reference to drawings.

Figure 1:
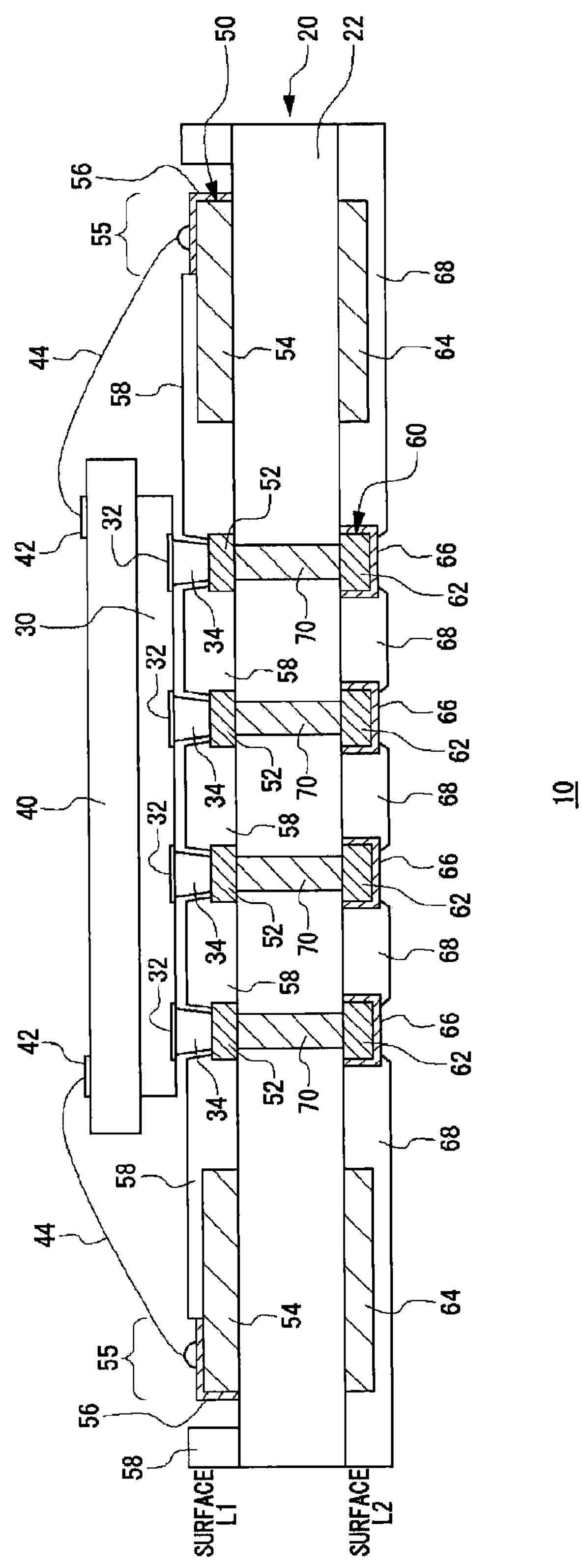
FIG. 1 is a cross-sectional view of a circuit device according to an embodiment of the present invention.

FIG. 1 is a cross-sectional view of a circuit device according to an embodiment of the present invention. A circuit device 10 includes a wiring substrate 20, a first circuit element 30, and a second circuit element 40.

The wiring substrate 20 is a two-layered substrate that includes an insulating resin layer 22 serving as a core, a wiring layer 50 provided on one face (hereinafter referred to as surface L1) of the insulating resin layer 22, and a wiring layer 60 provided on the other face (hereinafter referred to as surface L2) of the insulating resin layer 22.

The material used for the insulating resin layer 22 is, for instance, a melamine derivative, such as BT resin, or a thermosetting resin, such as liquid-crystal polymer, epoxy resin, PPE resin, polyimide resin, fluorine resin, phenol resin or polyamide bismaleimide. From the viewpoint of improving the heat radiation of the circuit device 10, it is preferable that the insulating resin layer 22 has a high thermal conductivity. In this respect, it is desirable that the insulating resin layer 22 contains, as a high thermal conductive filler, silver, bismuth, copper, aluminum, magnesium, tin, zinc, or an alloy thereof.

The wiring layer 50 includes first interconnectors 52 and wiring portions 54. As a material used for the wiring layer 50, a metal such as copper is used, for instance. More preferably, a rolled copper is used as the material for the wiring layer 50.

The first interconnector 52 is a terminal on which the first circuit device 30 is mounted. The film thickness of the first interconnector 52 is less than that of the wiring portion 54. That is, the first interconnector 52 is thinned as compared with the wiring portion 54.

The wiring portion 54 is provided in an area where no circuit device is mounted thereon. Of the wiring portion 54, a connection terminal part 55 used for the wire bonding connection is covered with a gold plating layer 56. The structure having the gold plating layer 56 like this can suppress the deterioration of connection terminal part 55 in the wiring portion 54.

A protective film (solder resist) 58 where the areas thereof covering the first interconnectors 52 and the connection terminal parts 55 of the wiring portions 54 serve as openings is formed on the surface L1 of the insulating resin layer 22.

The wiring layer 60 includes second interconnectors 62 and wiring portions 64. As a material used for the wiring layer 60, a metal such as copper is used, for instance. More preferably, a rolled copper is used as the material for the wiring layer 60.

The second interconnector 62 is used as a terminal for mounting the circuit device 10 on a motherboard. The second interconnector 62 is covered with a gold plating layer 66. A protective film (solder resist) 68 where the areas thereof covering the second interconnectors 62 serve as openings is formed on the surface L2 of the insulating resin layer 22.

The wiring portion 64 is a rewiring necessary for the repositioning of the second interconnector 62. According to the present embodiment, the thickness of the second interconnector 62 is equal to that of the wiring portion 64.

A conductor 70 penetrates the insulating resin layer 22, thereby connecting electrically the first interconenctor 52 and the second interconnector 62. A material that constitutes the conductor 70 may be copper, silver paste or copper paste, for instance.

The first circuit element 30 is mounted on the surface L1 of the insulating resin layer 22. The first circuit element 30 may be an IC or LSI, for instance. According to the present embodiment, the first circuit element 30 is flip-chip connected in a manner such that an electrode forming face thereof is placed downward. More specifically, an external electrode 32 formed on the first circuit element 30 is electrically connected to the first interconnector 52 provided on the wiring substrate 20 through the medium of a bump 34.

The second circuit element 40 is mounted on the first circuit element 30 through the medium of a bonding material such as die-attach film. The second circuit element 40 may be an IC or LSI, for instance. An external electrode 42 of the second circuit element 40 is connected to the connection terminal part 55 in the wiring portion 54 by a wire bonding using a gold wire 44.

By employing the circuit device 10 described as above, the first interconnector 52 is thinner than the wiring portion 54. Thus the height of the circuit device 10 including the first circuit element 30, mounted on the first interconnector 52, and the second circuit element 40, mounted on the first element 30, can be made smaller. That is, the circuit device 10 can be made smaller in height.

The amount of metal (i.e., "copper" in the embodiment) provided on the surface L1 of the insulating resin layer 22 is reduced by a reduction in thickness of the first interconnector 52 relative to the wiring portion 54. This reduces warping of the circuit device 10, thereby enhancing the reliability of the circuit device 10 mounted on the motherboard.

Also, when the circuit device 10 is mounted on the motherboard, the distance between the first circuit element 30 and the motherboard decreases. Hence, the heat radiation property of the circuit device 10 is enhanced.

(Manufacturing Method)

FIG. 2A to FIG. 4 are cross-sectional views illustrating processes in a method for manufacturing a circuit device according to an embodiment.

Figure 2A:
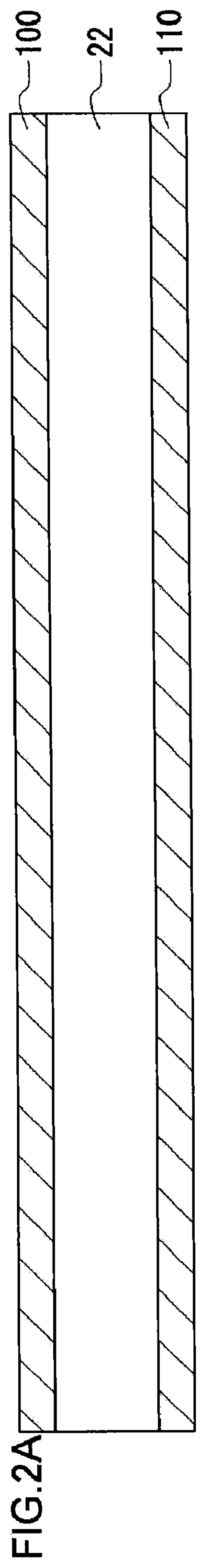
FIGS. 2A to 2C are cross-sectional views showing a process in a method for manufacturing a circuit device according to an embodiment of the present invention.

As shown in FIG. 2A, copper foils 100 and 110 are press-bonded respectively to one face of the insulating resin layer 22 and the other face thereof. Rolled coppers may be used as the copper foils 100 and 110.

Figure 2B:
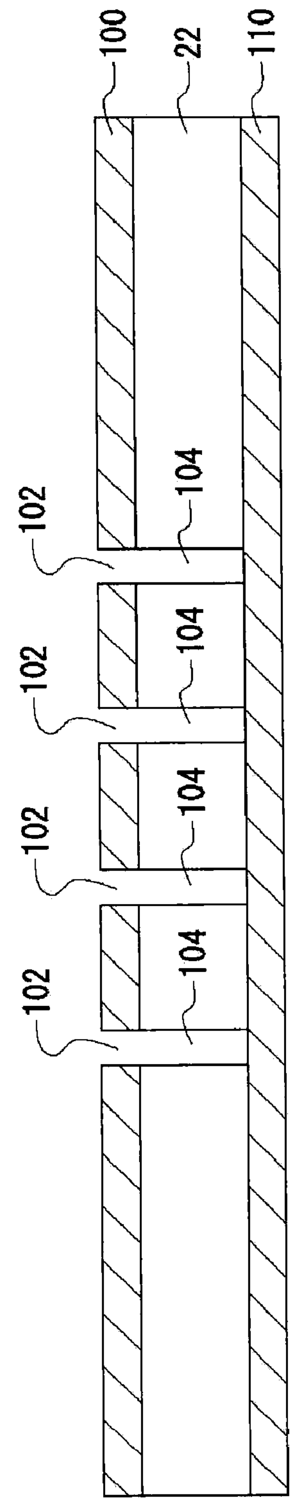

Then, as shown in FIG. 2B, openings 102 are formed on the copper foil 100 by an etching technique or the like in accordance with the positions of the conductors. Then, through holes 104 are formed in the insulating resin layer 22 by laser irradiation.

Figure 2C:
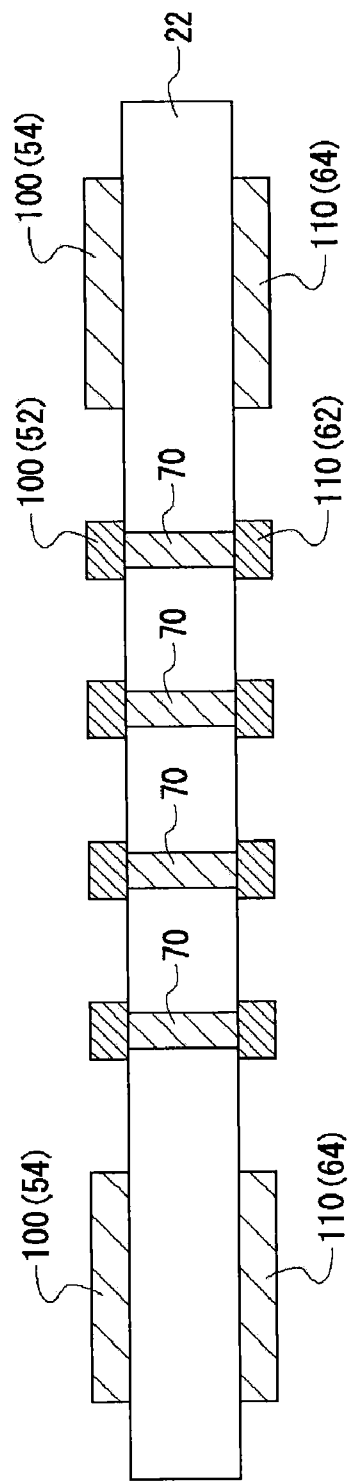

Then, as shown in FIG. 2C, the conductors 70 made of copper are formed in the through holes 104 by using an electroless plating method and an electrolytic plating method. Then the copper foils 100 and 110 are patterned by using a photolithography method and an etching method. At this stage, the film thickness of the copper foil 100 is kept constant. The thus patterned copper foil 100 becomes the first interconnectors 52 and the wiring portions 54. Also, the thus patterned copper foil 110 becomes the second interconnectors 62 and the wiring portions 64.

Figure 3A:
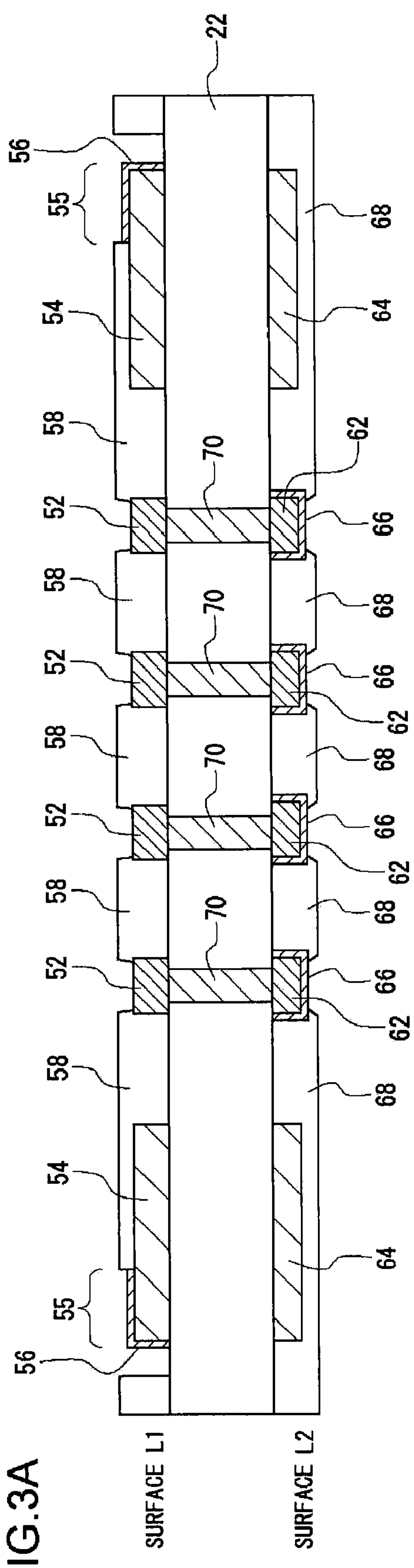
FIGS. 3A and 3B are cross-sectional views showing a process in a method for manufacturing a circuit device according to an embodiment of the present invention.

Then, as shown in FIG. 3A, a protective film 58 (solder resist film) where openings are provided at predetermined positions are formed on the surface L1 of the insulating resin layer 22. After this, a connection terminal part 55 in the wiring portion 54 and the second interconnector 62 are covered with gold plating layers 56 and 66, respectively, by nickel-gold plating. It is preferable that a gold-resist be formed on the copper excluding an area thereof where the gold plating layer needs to be formed. Subsequently, a protective film 68 where the areas thereof covering the second interconnectors 62 serve as openings is formed on the surface L2 of the insulating resin layer 22.

Figure 3B:
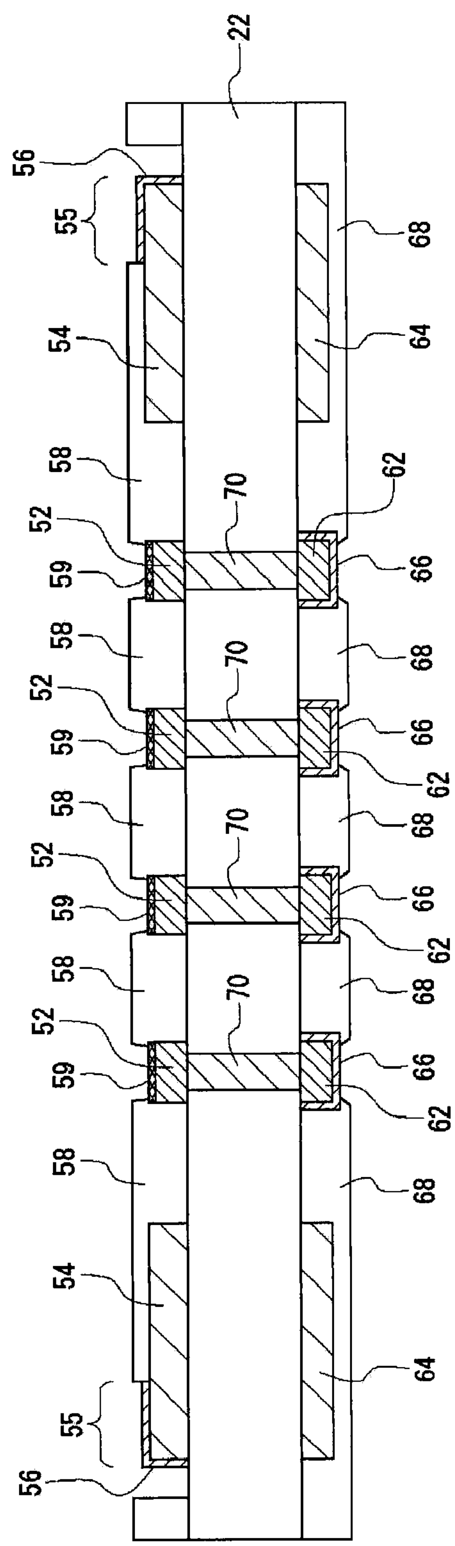

Next, as shown in FIG. 3B, the first interconnectors 52 undergo an organic solderability preservative (OSP) processing. In the OSP processing, a pre-flux liquid where imidazole compounds are dissolved into a solvent are used, for instance. As a result of this OSP processing, a pre-flux film 59 of 0.5 μm to 2 μm thickness, for example, is formed on the surface of the first interconnector 52. The pre-flux film 59 is formed as follows. The copper solved out of the first interconnector 52 reacts with the imidazole compounds so as to become a copper-imidazole complex. This forms the pre-flux film 59. Accordingly, the first interconnector 52 is so thin-filmed that it is thinner by the film thickness of the pre-flux film 59. On the other hand, the second interconenctor 62 is covered with the gold plating layer 66 whose ionization tendency is smaller than that of copper, at portions coming in contact with pre-flux liquid. Hence, the second interconnectors 62 are not affected by the OSP processing, so that the pre-flux films 59 are formed only on the first interconnectors 52.

Figure 4:
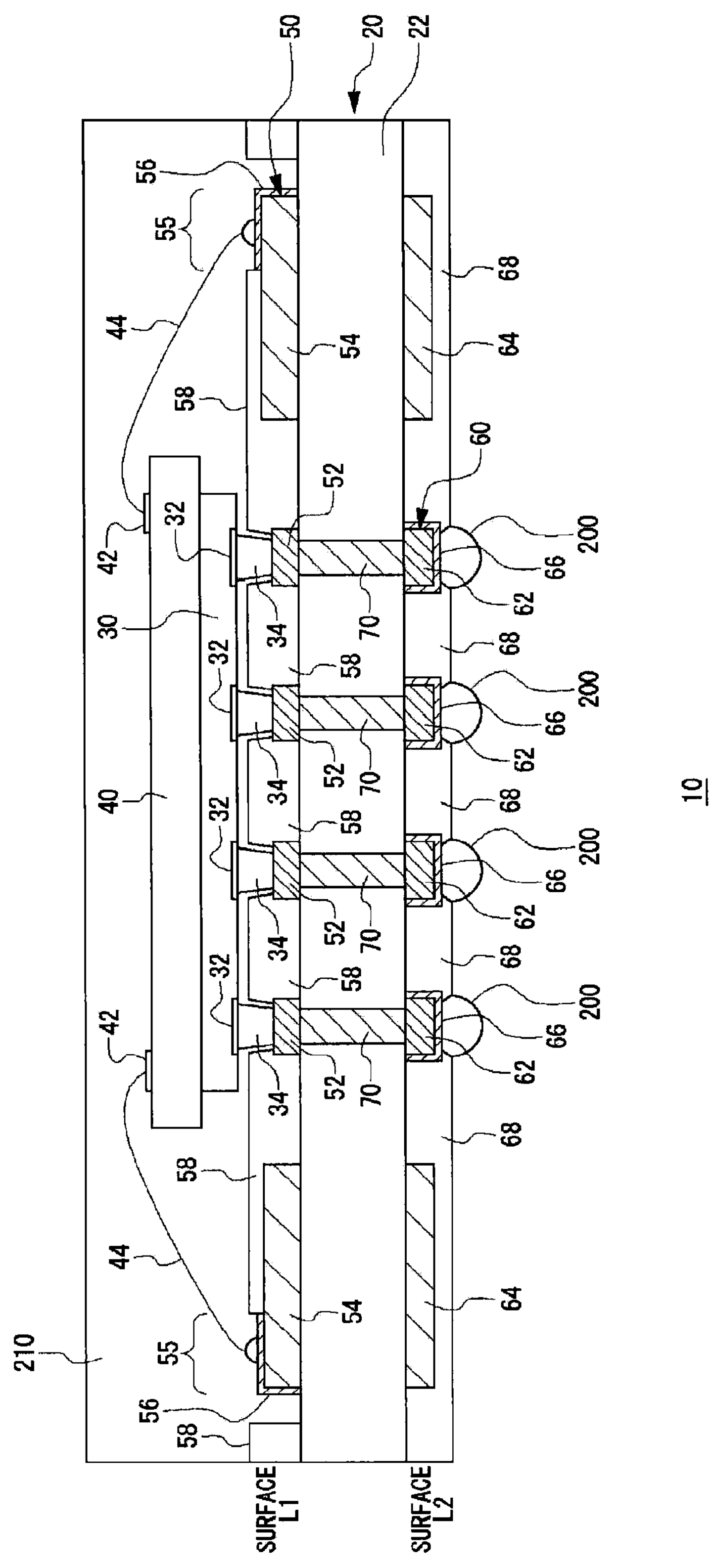
FIG. 4 is a cross-sectional view showing a process in a method for manufacturing a circuit device according to an embodiment of the present invention.

Next, as shown in FIG. 4, the first interconnectors 52 and the external electrodes 32 of the first circuit element 30 are connected by using the solder bumps 34, and thereby the first circuit element 30 is flip-chip connected to the wiring substrate 20. Further, the second circuit element 40 is mounted on the first circuit element 30 via a bonding material (not shown) such as a die-attach film. Then, the external electrodes 42 of the second circuit element 40 and the connection terminal parts 55 in the wiring portions 54 are connected using gold wires 44. Through the processes as described above, a circuit device as shown in FIG. 1 is manufactured. As shown in FIG. 4, solder bumps 200 may be formed on the second interconnectors 62 as necessary. Also, the circuit device 10 may be packaged by a molded resin 210, using a transfer mold method or the like.

The present invention is not limited to the above-described embodiments, and it is understood by those skilled in the art that various modifications such as changes in design may be made based on their knowledge and the embodiments incorporating such modifications are also within the scope of the present invention.

Though the wiring substrate having a two-layer wiring structure as a wiring layer is exemplified in the above-described embodiment, the wiring substrate may have multilevel interconnection of three or more layers.

The metal that covers the second interconnector 62 is one whose ionization tendency is smaller than that of the metal constituting the first interconnector 52. Such a metal is not limited to gold, and the metal covering the second interconnector may be platinum, silver, lead, solder, or the like.

What is claimed is:

1. A wiring substrate on which a circuit element is mounted, the wiring substrate comprising:

a substrate;

a first interconnector and a first wiring portion on one face of the substrate; and a protective film provided with openings corresponding to a connection terminal part of the first interconnector and a connection terminal part of the first wiring portion, wherein the film thickness of the first interconnector is less than that of the first wiring portion, an upper surface of the first interconnector is lower than an upper surface of the first wiring portion, and the connection terminal part of the first wiring portion is covered with a metal whose ionization tendency is smaller than that of a metal forming the first interconnector.

2. The wiring substrate according to claim 1 further comprising:

a second interconnector on the other face of the substrate; and a conductor that penetrates through the substrate and electrically connects the first interconnector and the second interconnector, wherein the second interconnector is covered with a metal whose ionization tendency is smaller than that of a metal forming the first interconnector.

3. The wiring substrate of claim 1, wherein the film thickness of the first connector comprises a thickness in a direction normal to the one face of the substrate.

4. A circuit device, comprising a wiring substrate, the wiring substrate comprising:

a substrate;

a first interconnector and a first wiring portion on one face of the substrate; and a protective film provided with openings corresponding to a connection terminal part of the first interconnector and a connection terminal part of the first wiring portion, wherein the film thickness of the first interconnector is less than that of the first wiring portion, an upper surface of the first interconnector is lower than an upper surface of the first wiring portion, and the connection terminal part of the first wiring portion is covered with a metal whose ionization tendency is smaller than that of a metal forming the first interconnector, the circuit device further comprising:

a first circuit element flip-chip connected to the first interconnector; and a second circuit element mounted on the first circuit element, wherein the metal covering the connection terminal part of the first wiring portion is connected to the second circuit element by a wire.

5. The circuit device according to claim 4 further comprising:

a second interconnector on the other face of said substrate; and a conductor that penetrates through the substrate and electrically connects the first interconnector and the second interconnector, wherein the second interconnector is covered with a metal whose ionization tendency is smaller than that of a metal forming the first interconnector.

* * * * *